United States Patent [19]

Ohtani et al.

[11] Patent Number: 5,123,789
[45] Date of Patent: Jun. 23, 1992

[54] METHOD OF AND APPARATUS FOR MACHINING PRINTED CIRCUIT BOARD

[75] Inventors: Tamio Ohtani, Hadano; Yasuhiko Kanaya, Machida; Tuyoshi Yamaguchi, Hadano, all of Japan

[73] Assignee: Hitachi Seiko, Ltd., Tokyo, Japan

[21] Appl. No.: 316,952

[22] Filed: Feb. 28, 1989

[51] Int. Cl.$^5$ .............................. B23B 35/00
[52] U.S. Cl. ......................... 408/1 R; 408/95; 408/16; 408/10; 408/13
[58] Field of Search ............. 408/1, 3, 13, 87, 95, 408/97, 100, 116, 8, 10, 14, 16, 98, 96, 51, 110–112; 83/71, 527, 530; 364/474.34, 474.18, 474.02, 551.02

[56] References Cited

U.S. PATENT DOCUMENTS

| | | | |
|---|---|---|---|
| 4,340,326 | 7/1982 | Buonauro | 408/16 |
| 4,596,500 | 6/1986 | Raiteri | 408/16 X |
| 4,717,291 | 1/1988 | Zafir | 408/13 |
| 4,725,172 | 2/1988 | Shiina | 408/13 X |
| 4,745,557 | 5/1988 | Pekar et al. | 408/8 X |
| 4,765,784 | 3/1988 | Karwan | 408/13 |
| 4,786,216 | 11/1988 | Kitagawa et al. | 408/87 X |
| 4,865,494 | 9/1989 | Gudow | 408/95 X |

FOREIGN PATENT DOCUMENTS

| | | |
|---|---|---|
| 131804 | 6/1986 | Japan . |
| 44337 | 2/1987 | Japan . |
| 1255298 | 9/1986 | U.S.S.R. .............................. 408/16 |

*Primary Examiner*—Larry I. Schwartz
*Assistant Examiner*—R. Schultz
*Attorney, Agent, or Firm*—Antonelli, Terry, Stout & Kraus

[57] ABSTRACT

A method of and apparatus for effecting a machining operation, e.g. drilling, on a multi-layered printed circuit board utilizing a machining apparatus having a spindle for driving a tool. The spindle is movable in the axial direction of the tool and a pressure foot for pressing the printed circuit board during the machining is mounted on the spindle for relative movement with respect thereto. The method includes the steps of determining the position of the end of a tool with respect to the end of a pressure foot in the state before the pressure foot contacts the printed circuit board, setting the amount of relative movement between the pressure foot and the tool necessary for effecting the desired machining, on the basis of the position of the end of the tool and a predetermined set value of the machining depth; and effecting the machining on the printed circuit board by controlling the feed of the tool in conformity with the amount of relative movement.

10 Claims, 3 Drawing Sheets

F I G. 1
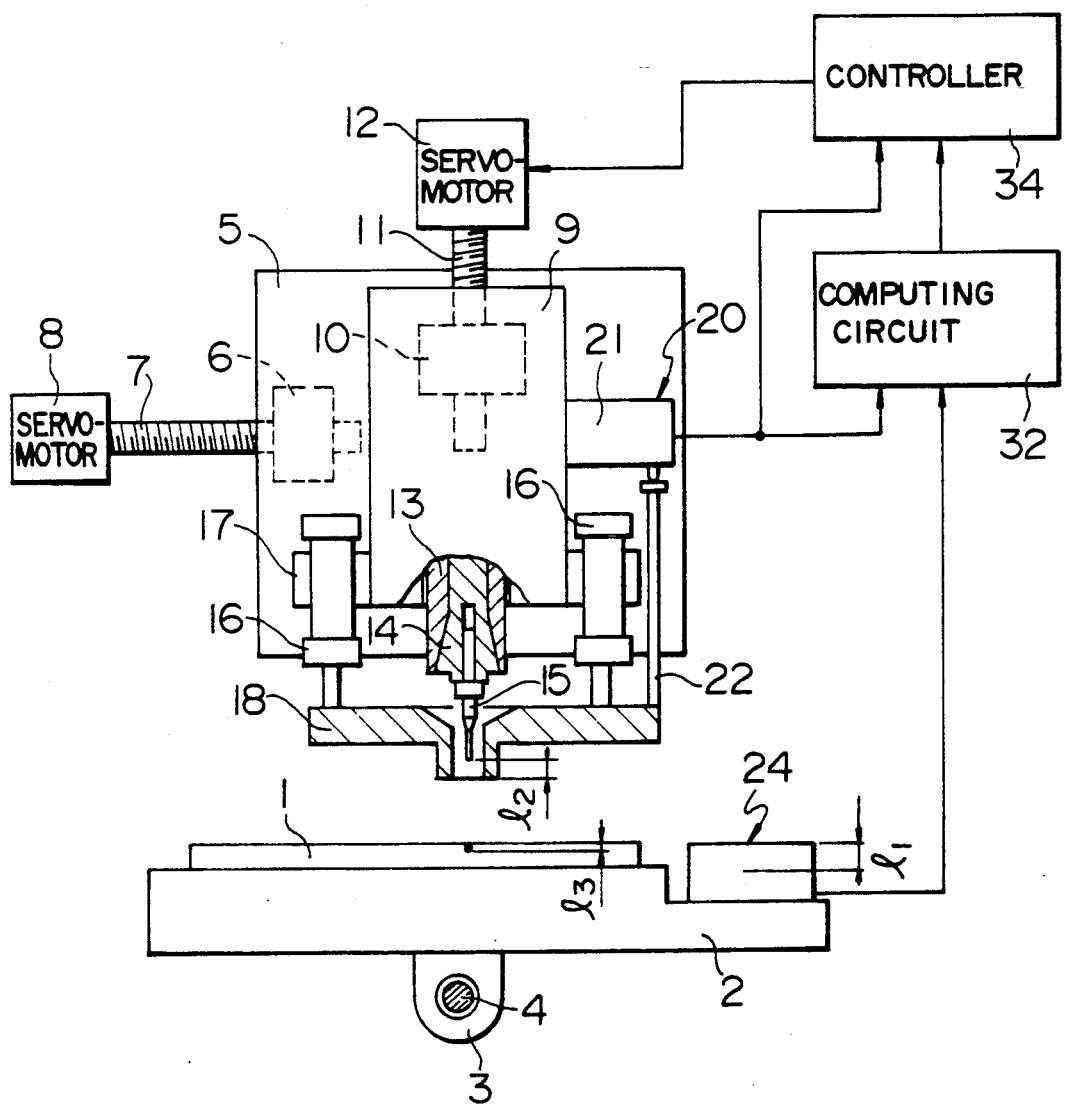

METHOD OF AND APPARATUS FOR MACHINING PRINTED CIRCUIT BOARD

BACKGROUND OF THE INVENTION

The present invention relates to method of and an apparatus for machining a printed circuit board with high precision. More particularly, the present invention is directed to method of and apparatus for machining a printed circuit board suitable for forming closed holes and/or grooves with a high degree of dimensional precision in the direction of depth of such bores and grooves.

There has recently been an increasing demand for higher packaging density of wirings and electronic components on printed circuit boards, and multi-layered printed circuit boards which meet such demands are becoming popular. This also has given a rise to the demand for various mechanical processing or machining techniques to be effected on a printed circuit board, such as formation of closed holes for providing electrical connection between circuits of inner layers, face-up machining for forming recesses for situating integrated circuits (ICs) and other components, and so forth.

Such machining has to be effected with a high degree of precision in the depthwise direction, within a very small tolerance of ±0.05 mm or smaller. Japanese Patent Unexamined Publication No. 61-131804 discloses a machining method which permits a hole which reaches the desired circuit on an intermediate layer of a multi-layered printed circuit board to be formed, provided that such a circuit is exposed at an end surface of the multi-layered printed circuit board.

In general, however, a printed circuit board which constitutes one of the inner layers of a multi-layered printed circuit board usually has a predetermined circuit pattern which has been formed by etching, and is usually provided with a peripheral frame or cleat for forming reference holes therein. In such a case, it is not a practical method to control the drilling depth by means of an electrical signal exchanged between a drill and an electrode which is set on one end surface of the multi-layered printed circuit board.

Japanese Patent Publication No. 62-44337 shows a device in an industrial machine tool used for heavy industrial operations such as milling and drilling wherein the length of the tool in the tooling station is measured. However, such an arrangement is not acceptable for producing the dimensional precision needed in today's printed circuit boards, particularly relatively thin and closely packed surface mount technology (SMT) boards where blind holes must be drilled with great depth accuracy. The prior art device does not take into account dimensional variations in thickness of the work being processed which in the case of a printed circuit board can be 0.15 mm, the mounting condition of the tool which can vary in a circuit board drilling machine by ±0.02 mm, thermal distortion of the machine itself up to 0.02 mm, flatness of the machine table which can amount to 0.03 mm, and pitching and rolling of the machine table which can amount to 0.01 mm. While such variables might not be critical in heavier industrial machining operations of the type with which the machine of the aforesaid Publication No. 62-44337 is intended to be used, we have recognized them to be serious obstacles to the attainment of needed dimensional accuracy in drilling printed circuit boards.

SUMMARY OF THE INVENTION

Accordingly, an object of the present invention is to provide a method of effecting mechanical processing on a printed circuit board with a high degree of dimensional precision in the depthwise direction of a hole, groove or the like which is to be formed by the mechanical processing, as well as an apparatus for carrying out such a method.

To this end, according to the present invention, there is provided a method of machining a printed circuit board comprising the steps of determining the position of the end of a tool with respect to the end of a pressure foot in the state before the pressure foot contacts the printed circuit board, setting the amount of relative movement between the pressure foot and the tool necessary for effecting the desired machining on the basis of the position of the end of the tool and a predetermined set value of the machining depth, and effecting machining of the printed circuit board by controlling the feed of the tool in conformity with the amount of relative movement.

The present invention provides an apparatus for machining a printed circuit board having a spindle head for holding and rotating a tool and capable of moving in the axial direction of the tool, and a pressure foot carried by the spindle for relative movement with respect to the spindle head in the axial direction of the tool and capable of pressing a printed circuit board which is placed on a table during the machining. The apparatus further comprises a first detector arranged to act between the spindle head and the pressure head and capable of detecting the amount of relative movement between the spindle head and the pressure foot, a second detector provided on the table and capable of receiving the pressure foot when the spindle head has been moved by a predetermined amount and of detecting the position reached by the end of the tool, a computing arrangement for determining the distance between the end of the tool held by the spindle head and the end of the pressure foot from the amount of the relative movement detected by the first detector and the position reached by the end of the tool detected by the second detector; and a controller for determining and setting the amount of feed necessary for the machining on the basis of a predetermined set value of the machining depth and the distance determined by the computing arrangement and for controlling the amount of feed of the spindle head in conformity with the set amount of feed.

In the present invention, a multi-layered printed circuit board is supported by a table. A drill is held by a spindle head. The spindle head also supports a pneumatic cylinder which is supplied with air of a predetermined constant pressure. The pneumatic cylinder has a rod which supports a pressure foot. A first detector has components which are disposed on the spindle head and the pressure head, respectively, while a second detector is fixed on the table. A computing circuit is connected both to the first detector and to the second detector. A control circuit is connected to the first detector and to the computing circuit so as to control the operation of a servomotor.

In operation, after renewing or setting the drill, the drill is located at a position right above the second detection means through a relative movement between the table and the spindle head. Then, the servomotor is started so as to lower the spindle head. As a result, the end of the pressure foot is brought into contact with the second detector so that further movement of the pressure foot is stopped but the spindle head continues to move further downward by the power of the servomotor, thus commencing a relative movement between itself and the pressure foot. The air supply line leading to the pneumatic cylinder is provided with a relief valve which relieves air when the air pressure has become higher than a set level, so that the pneumatic cylinder is supplied with air of a constant pressure.

The first detector starts to produce pulses in response to the start of the relative movement between the spindle head and the pressure foot, so that the amount of relative movement between the spindle head and the pressure foot is detected by counting the number of the pulses.

The downward movement of the spindle head is stopped in accordance with instructions given by the controller when the spindle head has been lowered to a predetermined level. Then, the drill is inserted into the second detector so that the position reached by the end of the drill is detected by the second detector.

The distance between the end of the drill and the end of the pressure foot is then determined as the difference between the amount of the relative movement between the spindle head and the pressure foot and the position or distance reached by the drill.

The thus determined distance is added to a predetermined set value of the machining depth which is beforehand set in the controller, and the sum is set as the amount of the relative movement between the spindle head and the pressure foot, i.e. as the amount of feed which is to be effected for the purpose of performing the desired machining.

During the machining, the amount of the relative movement between the spindle head and the pressure foot, performed after the pressure foot is brought into contact with the multilayered printed circuit board, is detected and compared with the above-mentioned amount of feed, and the servomotor is reversed or stopped when the difference has become zero.

According to this method, it is possible to effect a machining with a high degree of depthwise dimensional precision, i.e. with a very small error with respect to the predetermined set value of the machining depth because the distance between the end of the drill and the end of the pressure foot is free of all errors or fluctuations which would affect the depthwise machining precision and the machining can be achieved with a high degree of precision by using this distance as a reference.

BRIEF DESCRIPTION OF THE DRAWINGS

These and other features, objects and advantages of the present invention will become more apparent from the following detailed description when taken in conjunction with the accompanying drawings wherein:

FIG. 1 is a schematic block diagram of an essential potion of one embodiment of the apparatus for machining a printed circuit board in accordance with the novel method of the present invention;

DESCRIPTION OF THE PRESENTLY PREFERRED EMBODIMENTS

Figure 2:
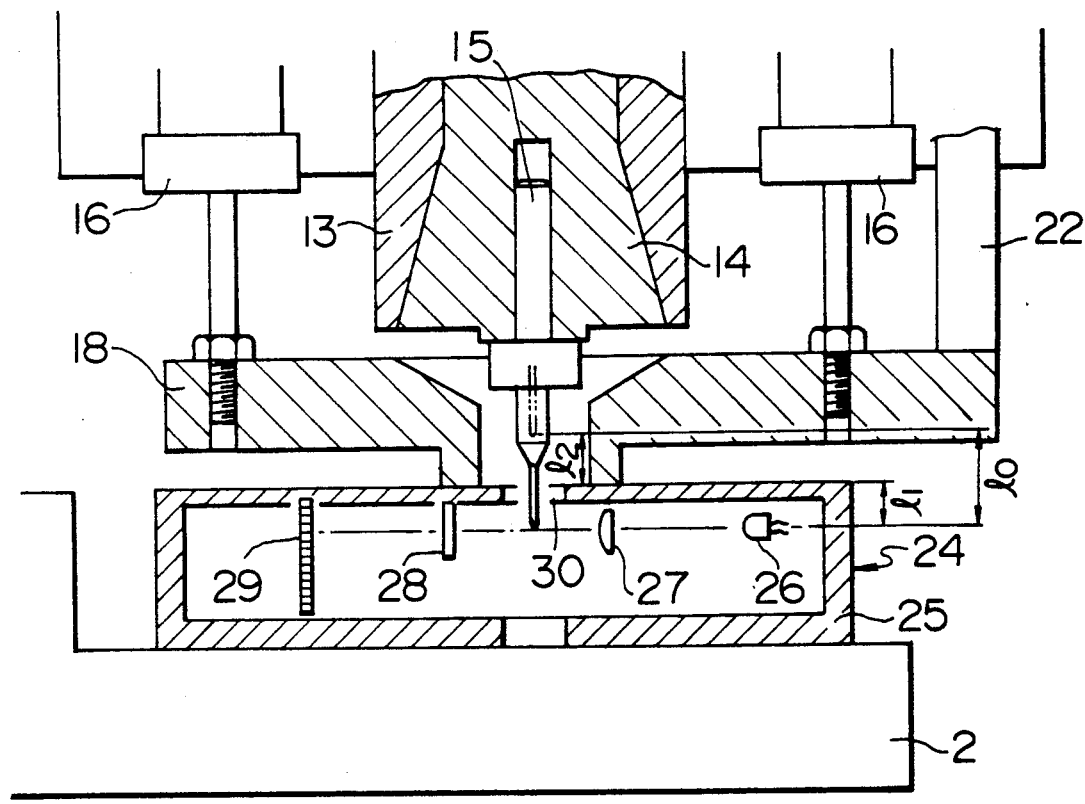
FIG. 2 is a schematic sectional view of a second detector incorporated in the apparatus shown in FIG. 1.

FIGS. 1 and 2 show an embodiment of the apparatus in accordance with the present invention designed to form a hole of a predetermined depth in a multi-layered printed circuit board. A table 2 which is rockably supported by a guide member (not shown). A multi-layered printed circuit board 1 is fixedly carried by the table 2. A nut 3 is fixed to the underside of the table 2. A rotatable feed screw 4 is rotatable by a servomotor (not shown) and is in screw threaded engagement with the nut 3. A nut 6 (shown in dotted lines) is fixed to the rear surface of a slider 5 which is rockably supported by a guide member (not shown). A rotatably feed screw 7, is in screw threaded engagement with the nut 6 and is driven by a servomotor 8.

A spindle head 9 is slidably supported by the slider 5. A nut 10 (shown in dotted lines) is fixed to the rear surface of the spindle head 9. A rotatable feed screw 11 is in screw threaded engagement with the nut 10 and is driven by a servomotor 12. The spindle head 9 rotatably carries a spindle 13 which is driven by a motor (not shown). A collet chuck 14 is slidably mounted on the spindle 13 so as to be actuated by an actuator which also is not shown, and detachably holds a drill 15. Pneumatic cylinders 16 are held by the spindle head 9 via a bracket 17 and are supplied with air of a instant predetermined pressure. A pressure foot 18 is attached to the rod of the pneumatic cylinders 16.

A first detector 20 is constituted by a scale 21 fixed to the spindle head 9. An operation rod 22 is fixed to the pressure foot 18 and has one end held in contact with a movement detector of the scale 21. The first detector 20 detects the amount of relative movement between the spindle head 9 and the pressure foot 18.

A second detector 24 (FIG. 2) includes a housing 25 fixed on the table 2, a lamp 26 disposed at a predetermined position in the housing 25, a lens 27, a columnar lens 28, and a charge-coupled device 29. A hole 30 for receiving the drill 15 is formed between the lens 27 and the columnar lens 28. The shadow cast by illumination of the drill 15 by the lamp 26 is detected by the charge-coupled device 29 so that the position of the end of the drill 15 is accurately detected. The first and second detectors 20, 24 are connected to a computing circuit 32. A controller 34 is connected to the first detector 20 so as to control the operation of the servomotor 12.

In operation, after setting the drill 15 in the collet chuck 14, the table 2 and the slider 5 are moved to a position right above the hole 30 in the second detector 24. The servomotor 12 is then operated to lower the spindle head 9 to a predetermined position. As a result, the pressure foot 18 is also lowered because it accompanies the spindle head 9 and is brought into contact with the housing 25 of the second detector 24 where it is stopped by the housing 25 as shown in FIG. 2. However, the spindle head 9 is allowed to move further downward relative to the pressure foot 18 as a result of which the scale 21 produces a number of pulses corresponding to the relative movement between the spindle head 9 and the pressure foot 18. In other words, the amount of relative movement between the spindle head 9 and the pressure foot 18 is detected by counting the number of pulses produced by the scale 21.

The end of the drill 15 is then inserted into the housing 25 through the hole 30. In this state, as shown in FIG. 2, the position of the end of the drill 15 is detected by the charge-coupled device 29. The computing circuit 32 executes a computation to subtract the reach $l_1$ of the drill between the top surface of the second detector 24 and the end of the drill detected by the device 29 from the amount $l_0$ of the relative movement between the spindle head 9 and the pressure foot 18 detected by the first detector 20, thus determining the distance $l_2$ between the end of the drill 15 and the end of the pressure foot 18 in the state before the relative movement between the end of the drill 15 and the end of the pressure foot 18 is commenced. The distance $l_2$ is input to the controller 34.

The controller 34 computes the sum of a predetermined set value of the predetermined set value of machining depth $l_3$ and the distance $l_2$, thus determining the amount of relative movement between the spindle head 9 and the pressure foot 18 as the amount of feed. The servomotor 12 is then reversed to raise the spindle head 9 to a predetermined level, and the table 2 and the slider 5 are moved so as to locate the drill 15 over the multi-layered printed circuit board 1.

The servomotor 12 is then started in accordance with instructions from the controller 34 so as to lower the spindle head 9. The relative movement between the spindle head 9 and the pressure foot 18 is commenced when the pressure foot 18 presses the top surface of the multi-layered printed circuit board 1. The pulses produced by the scale 20 during this relative movement are counted so that a distance equal to $l_2 + l_3$ is traversed accurately. The servomotor 12 is thereupon reversed when the predetermined number of pulses has been counted, i.e. the total of the relative movement between the spindle head 9 and the pressure foot 18 ($l_2$) and the previously set value of feed of the drill ($l_3$), so that the spindle head 9 can be raised, thus completing one cycle of drilling operation.

As has been described, according to the present invention, the distance $l_2$ between the end of the drill 15 held on the spindle head 9 and the end of the pressure foot 18 is determined, and the sum of the distance $l_2$ and the predetermined set value $l_3$ of the machining depth is set as the amount of feed of the tool during the machining. The machining is then effected while controlling the amount of the relative movement between the spindle head 9 and the pressure foot 18. In general, precision of machining such as drilling is often hindered by various fluctuation factors such a fluctuation in the length of the drill 15 used, fluctuation of the mounting position of the drill 15 on the spindle 13, wear of the end of the pressure foot 18, fluctuation in the thickness of the multi-layered printed circuit board 1, thermal distortion of the drilling machine, and so forth. The present invention cancels the influence of all such extraneous fluctuations or changes so that a closed hole can be formed from the surface of the multi-layered printed circuit board with a high degree of dimensional precision in the depthwise direction.

The detection of the distance $l_2$ between the end of the drill 15 held on the spindle head 9 can be done automatically each time the drill 15 is reground or replaced, so that the drilling can be performed with a high degree of depthwise dimensional precision and without causing the efficiency of the work to be impaired.

In the embodiment described above, an optical sensor is used as the scale 21 in the first detector 20. Such an optical sensor is capable of detecting the relative movement between the spindle head 9 and the pressure foot 18 with a high degree of resolution, e.g., on the order of 1 to less then 10 $\mu m$ in terms of the movement of the detector on the scale 21.

Figure 3:
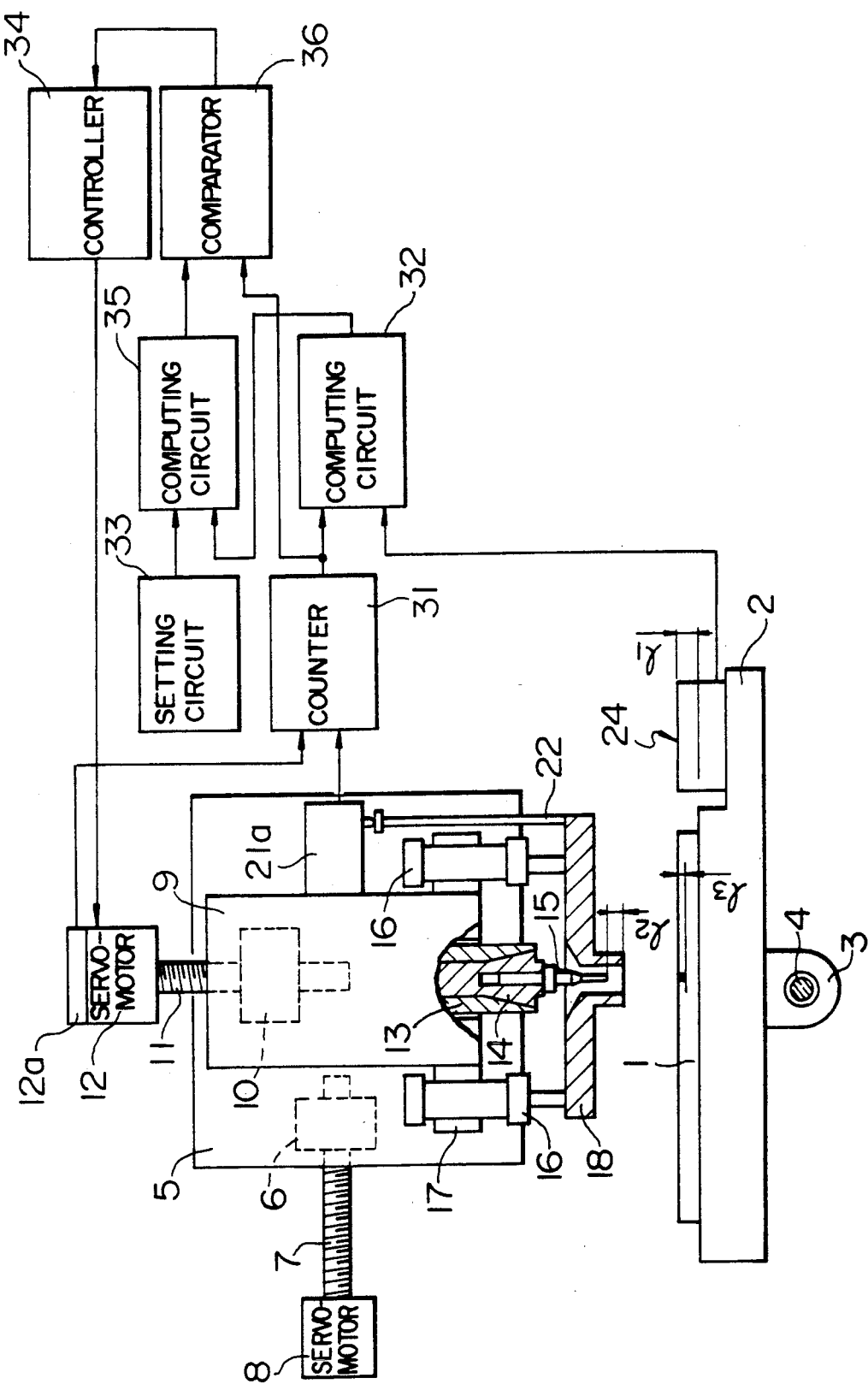
FIG. 3 is a schematic block diagram of an essential portion of another embodiment of the apparatus for carrying out the method in accordance with the present invention.

FIG. 3 shows a second embodiment of the apparatus in accordance with the present invention. The same reference numerals are used here to denote the same parts or members as those used in FIGS. 1 and 2.

A pulse encoder 12a is attached to the servomotor 12. A switch 21a is capable of generating a signal upon detection of the commencement of the relative movement between the spindle head 9 and the pressure foot 18. A counter 31 is connected to the pulse encoder 12a and the switch 21a such that the counter 31 starts to count the pulses from the pulse encoder 12a upon receipt of a signal from the switch 21a. The pulse encoder 21a, the switch 21a and the counter 31 comprise the first detector.

A computing circuit 32 detects the distance $l_2$ between the end of the drill 15 held by the spindle head 9 and the end of the pressure foot 18 in accordance with the outputs from the counter 31 and the second detector 24. A setting circuit 33 sets the machining depth $l_3$. Another computing circuit 35 computes the sum of the distance $l_2$ derived from the computing circuit 32 and the machining depth $l_3$ delivered by the setting circuit 33, thereby determining and setting the amount of the relative movement between the spindle head 9 and the pressure head 18 necessary for the machining.

A comparator circuit 36 compares the amount of feed set in the computing circuit 35 and the amount of the above-mentioned relative movement in terms of the number of the pulses counted by the counter 31, and produces a drilling stop signal when the difference between these values has become zero. The controller 34 then reverses the servomotor 12 in accordance with the output from the pulse encoder 12a attached to the servomotor 12. It will be clear to those skilled in the art that this embodiment also provides the same level of depthwise dimensional precision as the embodiment described in connection with FIGS. 1 and 2.

Although formation of a hole by drilling has been described as an example of the machining to be performed, it is to be noted that the invention can be applied to various types of machining which require high degree of depthwise dimensional precision. For instance, face-up machining for forming a flat-bottomed recess can be performed by horizontally moving the multi-layered circuit board and the tool relative to each other when the tool has reached a predetermined depth.

As has been described, according to the present invention, machining can be performed in such a manner as to eliminate the influences of all the fluctuating factors which would affect the depthwise machining precision, by virtue of the fact that the amount of feed of the spindle head is controlled in accordance with the distance between the end of the pressure foot and the end of the tool, whereby a high degree of depthwise dimensional precision is attained.

What is claimed is:

1. A method for machining a printed circuit board by a tool carried by a spindle and associated with a pressure foot, the method comprising the steps of detecting an amount of relative movement between said spindle and said pressure foot; detecting a position reached by an end of said tool when said spindle has moved a predetermined amount; determining a distance between an end of said tool carried by said spindle and an end of said pressure foot based upon the detected amount of said relative movement and said detected position reached by the end of said tool; setting an amount of feed necessary for a machining operation based on the amount of the relative movement between said spindle and said pressure foot on the basis of a predetermined set value of machining depth and the determined distance; comparing, during the machining operation, the detected amount of relative movement and the set amount of feed; producing a machining end signal when the difference between said amount of relative movement and said amount of feed has become zero; and producing a control signal for commencing another operation upon issuance of said machining end signal.

2. A method for machining a printed circuit board by a tool carried by a spindle and associated with a pressure foot, the method comprising the steps of issuing a sensing signal upon a sensing of a commencement of a relative movement between said spindle and said pressure foot; counting, in response to the sensing signal, values of pulses produced by a pulse encoder associated with a servomotor moving said spindle; detecting an amount of relative movement between said spindle and said pressure foot on the basis of counted values of pulses; detecting a position reached by an end of said tool when said spindle has moved a predetermined amount; determining a distance between the end of said tool and an end of said pressure foot, form the detected amount of said relative movement and said detected position reached by the end of said tool; setting an amount of feed necessary for a desired machining operation in dependence upon the amount of the relative movement between said spindle and said pressure foot; comparing, during the machining operation, the amount of detected relative movement and the set amount of feed; producing a machining end signal when the difference between said amount of relative movement and said amount of feed becomes zero; and producing a control signal for commencing another machining operation upon an issuance of said machining end signal.

3. An apparatus for machining a printed circuit board supported by a table, the apparatus comprising a spindle head for holding and rotating a tool and movable in an axial direction of said tool, a pressure foot carried by said spindle head for relative movement with respect to said spindle head in the axial direction of said tool and adapted to press the printed circuit board supported on said table during a machining operation, first detection means for detecting an amount of relative movement between said spindle head and said pressure foot; second detection means provided on said table and adapted to receive said pressure foot when said spindle head has been moved by a predetermined amount for detecting a position reached by an end of said tool, computing means for determining a distance between the end of said tool and an end of said pressure foot based upon the amount of said relative movement detected by said first detection means and said position reached by the end of said tool detected by said second detection means, and controlling means for determining and setting an amount of feed necessary for the machining operation on the basis of a predetermined set value of machining depth and the distance determined by said computing means and for controlling the amount of feed of said spindle head to conform with the set amount of feed.

4. An apparatus for machining a printed circuit board supported by a table, the apparatus comprising a spindle head for holding and moving a tool and adapted to move in an axial direction of said tool, a pressure foot carried by said spindle head for relative movement with respect to said spindle head in the axial direction of said tool and adapted to pres the printed circuit board supported on said table during a machining operation, first detection means for detecting an amount of relative movement between said spindle head and said pressure foot, second detection means provided on said table and adapted to receive said pressure foot when said spindle head has been moved by a predetermined amount and for decting a position reached by an end of said tool, computing means for determining a distance between the end of said tool and an end of said pressure foot based upon the amount of said relative movement detected by said first detection means and said position reached by the end of said tool detected by said second detection means, setting means for setting an amount of feed necessary for the machining operation in dependence upon the amount of the relative movement between said spindle head and said pressure foot on the basis of a predetermined set value of machining depth and the distance determined by said computing means, comparator means for comparing, during the machining operation, the amount of relative movement detected by said first detection means and the amount of feed set by said setting means and capable of producing a machining end signal when a difference between said amount of relative movement and said amount of feed becomes zero, and control means for producing a control signal for commencing a next operation upon receipt of said machining end signal.

5. An apparatus for machining a printed circuit board supported by a table, the apparatus comprising a spindle head for holding and moving a tool and adapted to be moved by a servomotor having a pulse encoder in an axial direction of said tool, a pressure foot carried by said spindle head for relative movement with respect to said spindle head in the axial direction of said tool and adapted to press a printed circuit board supported on the table during a machining operation, first detection means including first sensing means for sensing a commencement of a relative movement between said spindle head and said pressure foot and including counting means for counting, in response to a sensing signal from said first sensing means, pulses produced by the pulse encoder, said first detection means being operable to detect an amount of said relative movement between said spindle and said pressure foot on the basis of a number of pulses counted by said counter means, second detection means provided on said table and adapted to receive said pressure foot when said spindle head has been moved by a predetermined amount for detecting the position reached by an end of said tool, computing means for determining a distance between the end of said tool and an end of said pressure foot based upon said amount of said relative movement detected by said first detection means and said position reached by the end of said tool detected by said second detection means, and controlling means for determining and setting an amount of feed necessary for the machining operation on the basis of a predetermined set value of a machining depth and the distance determined by said computing means and for controlling the amount of feed of said spindle head in conformity with the set amount of feed.

6. An apparatus for machining a printed circuit board supported by a table, the apparatus comprising a spindle head for holding and moving a tool and adapted to be moved in an axial direction of said tool by a servomotor having a pulse encoder operatively associated there-with, a pressure foot carried by said spindle head for relative movement with respect to said spindle head in the axial direction of said tool and adapted to press a printed circuit board supported on said table during a machining operation, first detection means including first sensing means for sensing a commencement of a relative movement between said spindle head and said pressure foot and including counter means adapted to count, in response to a sensing signal from said first sensing means, pulses produced by the pulse encoder, said first detection means being operable to detect an amount of the relative movement between said spindle head and said pressure foot on the basis of a number of pulses counted by said counter means, second detection means provided on said table and adapted to receive said pressure foot when said spindle head has been moved by a predetermined amount for detecting a position reached by an end of said tool, computing means for determining a distance between the end of said tool and an end of said pressure foot, from the amount of said relative movement detected by said first detection means and said position reached by the end of said tool detected by said second detection means, setting means for setting an amount of feed necessary for the machining operation in terms of the amount of the relative movement between said spindle head and said pressure foot, comparator means for comparing, during the machining operation, the amount of relative movement detected by said first detection means and the amount of feed set by said setting means and for producing a machining end signal when the difference between said amount of relative movement and said amount of feed becomes zero, and control means for producing a control signal for commencing another machining operation upon receipt of said machining end signal.

7. A control system for a machine including a machine table, a machine tool holder associated with a tool, and a pressure foot operatively carried by said machine tool holder, the control system comprising first detection means for detecting an amount of relative movement between said machine tool holder and said pressure foot; second dection means provided on said machine table and adapted to receive said pressure foot when said tool holder has moved by a predetermined amount for detecting a position reached by an end of said tool; computing means for determining a distance between the end of said tool and an end of said pressure foot based upon the amount of said relative movement detected by said first detection means and said position reached by the end of said tool detected by said second detection means; and controlling means for determining and setting an amount of feed of said tool holder necessary for a machining operation on the basis of a predetermined set value of machining depth and the distance determined by said computing means and for controlling the amount of feed of said tool holder to conform to the set amount of feed.

8. A control system for a machine including a machine table, a machine tool holder associated with a tool, and a pressure foot operatively carried by said machine tool holder, the control system comprising first detection means for detecting an amount of relative movement between said machine tool holder and said pressure foot; second detection means provided on said machine table and adapted to receive said pressure foot when said tool holder has been moved by a predetermined amount for detecting a position reached by an end of said tool; computing means for determining a distance between the end of said tool and an end of said pressure foot based upon the amount of said relative movement detected by said first detection means and said position reached by the end of said tool detected by said second detection means; setting means for setting an amount of feed necessary for a machining operation in dependence upon the amount of the relative movement between said tool holder and said pressure foot on the basis of a predetermined set value of machining depth and the distance determined by said computing means; comparator means for comparing, during the machining operation, the amount of relative movement detected by said first detection means and the amount of feed set by said setting means and capable of producing a machining end signal when a difference between said amount of relative movement and said amount of feed becomes zero; and control means for producing a control signal for commencing a next operation upon receipt of said machining end signal.

9. A control system for a machine including a machine table, a machine tool holder associated with a tool, and a pressure foot operatively carried by said machine tool holder, the control system comprising first detection means including first sensing means for sensing commencement of a relative movement between said machine tool holder and said pressure foot and counting means for counting, in response to a sensing signal from said first sensing means, pulses produced by a pulse encoder provided on a servomotor for moving said tool holder, said first detection means being operable to detect an amount of relative movement between said tool holder and said pressure foot on the basis of a number of pulses counted by said counting means; second detection means provided on said machine table and adapted to receive said pressure foot when said tool holder has been moved by a predetermined amount for detecting a position reached by the end of said tool; computing means for determining a distance between the end of said tool and an end of said pressure foot based upon said relative movement detected by said first detection means and said position reached by the end of said tool detected by said second detection means; and controlling means for determining and setting an amount of feed necessary for a machining operation on the basis of a predetermined set value of a machining depth and the distance determined by said computing means and for controlling the amount of feed of said tool holder to conform to the set amount of feed.

10. A control system for a machine including a machine tool holder associated with a tool and a pressure foot operatively carried by said machine tool holder, the control system comprising first detection means including first sensing means for sensing a commencement of a relative movement between said machine tool holder and said pressure foot counter means adapted to count, in response to a sensing signal from said first sensing means, pulses produced by a pulse encoder operatively connected with a servomotor for moving said tool holder, said first detection means being operable to detect an amount of a relative movement between said tool holder and said pressure foot on the basis of a number of pulses counted by said counter means; second detection means provided on said machine table and adapted to receive said pressure foot when said tool holder has been moved by a predetermined amount for detecting a position reached by an end of the tool; computing means for determining a distance between the end of said tool and an end of said pressure foot, from the amount of said relative movement detected by said first detection means and said position reached by the end of said tool detected by said second detection means; setting means for setting an amount of feed necessary for a machining operation in terms of the amount of the relative movement between said tool holder and said pressure foot; comparator means for comparing, during the machining operation, the amount of relative movement detected by said first detection means and the amount of feed set by said setting means and for producing a machining end signal when a difference between said amount of relative movement and said amount of feed becomes zero; and control means for producing a control signal for commencing another machining operation upon receipt of said machining end signal.

* * * * *